(12) United States Patent
Rajasekhar et al.

(10) Patent No.: US 10,128,859 B1
(45) Date of Patent: Nov. 13, 2018

(54) CORRELATED DOUBLE SAMPLING ANALOG-TO-DIGITAL CONVERTER

(71) Applicant: Analog Devices Global Unlimited Company, Hamilton (BM)

(72) Inventors: Sanjay Rajasekhar, Newbury (GB); Roberto Sergio Matteo Maurino, Turin (IT)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 15/899,883

(22) Filed: Feb. 20, 2018

(51) Int. Cl.
*H03M 1/12* (2006.01)
*H03M 1/00* (2006.01)

(52) U.S. Cl.
CPC ................... *H03M 1/002* (2013.01)

(58) Field of Classification Search
CPC ........................................................ H03M 1/002
USPC .................................................. 341/144–155
See application file for complete search history.

(56) References Cited

U.S. PATENT DOCUMENTS

| | | | | |
|---|---|---|---|---|
| 5,406,283 A | * | 4/1995 | Leung | H03M 1/0665 341/143 |
| 6,342,919 B2 | * | 1/2002 | Opris | H04N 5/378 348/241 |
| 8,508,257 B2 | | 8/2013 | Kapusta et al. | |
| 8,593,317 B2 | * | 11/2013 | Aras | H04N 5/3577 341/155 |
| 8,700,075 B2 | * | 4/2014 | Riddle | G06Q 10/10 455/466 |
| 9,391,628 B1 | | 7/2016 | Lyden et al. | |

* cited by examiner

*Primary Examiner* — Lam T Mai
(74) *Attorney, Agent, or Firm* — Schwegman Lundberg & Woessner, P.A.

(57) ABSTRACT

Techniques are described to cancel kT/C sampling noise and residue amplifier sampling noise while also reducing power consumption in a pipelined analog-to-digital converter circuit.

22 Claims, 12 Drawing Sheets

CORRELATED DOUBLE SAMPLING ANALOG-TO-DIGITAL CONVERTER

FIELD OF THE DISCLOSURE

This document pertains generally, but not by way of limitation, to integrated circuits, and more particularly, to analog to digital converter circuits and systems.

BACKGROUND

In many electronics applications, an analog input signal is converted to a digital output signal (e.g., for further digital signal processing). For instance, in precision measurement systems, electronics are provided with one or more sensors to make measurements, and these sensors can generate an analog signal. The analog signal can then be provided to an analog-to-digital converter (ADC) circuit as input to generate a digital output signal for further processing. In another instance, in a mobile device receiver, an antenna can generate an analog signal based on the electromagnetic waves carrying information/signals in the air. The analog signal generated by the antenna can then be provided as input to an ADC to generate a digital output signal for further processing.

SUMMARY OF THE DISCLOSURE

Noise sources in a pipelined ADC circuit can include kT/C sampling noise from a capacitor DAC circuit and residue amplifier sampling noise. The kT/C sampling noise is inversely proportional to the size of the sampling capacitors; the larger sampling capacitors produce less noise. However, larger sampling capacitor can be difficult to drive and physically occupy significant die area.

By using various techniques of this disclosure, the inversely proportional relationship between the sampling noise and the size of the sampling capacitors is no longer true. The size of the sampling capacitors can be greatly reduced, which can reduce the die area and reduce the power consumption of the ADC, and the kT/C sampling noise can be canceled using correlated double sampling (CDS) techniques.

In some aspects, this disclosure is direct to a method for performing correlated double sampling in a pipelined analog-to-digital (ADC) circuit. The method comprises coupling an analog input signal onto: a first ADC circuit of a first stage of the pipelined ADC circuit; and a digital-to-analog converter (DAC) circuit of the first stage; opening a switch to decouple the DAC circuit of the first stage from a bias voltage, the opening resulting in a noise charge onto the DAC circuit of the first stage; sampling the noise charge; loading an output of the first ADC circuit of the first stage onto the DAC circuit of the first stage to generate a residue charge; sampling the combination of the noise charge and the residue charge; and subtracting the sampled noise charge from the sampled combination of the noise charge and the residue charge to cancel the noise charge.

In some aspects, this disclosure is direct to a method for performing correlated double sampling in a pipelined analog-to-digital ADC circuit. The method comprises coupling an analog input signal onto an ADC circuit of a first stage of the pipelined ADC circuit; loading an output of the first ADC circuit of the first stage onto the DAC circuit of the first stage; opening a switch to decouple the DAC circuit of the first stage from a bias voltage, the opening resulting in a noise charge onto the DAC circuit of the first stage; sampling the noise charge; coupling the analog signal onto the DAC circuit of the first stage to generate a residue charge; sampling the combination of the noise charge and the residue charge; and subtracting the sampled noise charge from the sampled combination of the noise charge and the residue charge to cancel the noise charge.

In some aspects, this disclosure is direct to a pipelined analog-to-digital converter (ADC) circuit for performing correlated double sampling. The circuit comprises a first ADC circuit of a first stage of the pipelined ADC circuit; a digital-to-analog converter (DAC) circuit coupled to an output of the first ADC; and a control circuit. The control circuit is configured to control operation of a plurality of switches to: couple an analog input signal onto: a first ADC circuit of a first stage of the pipelined ADC circuit; and the DAC circuit of the first stage; open a switch to decouple the DAC circuit of the first stage from a bias voltage, the opening resulting in a noise charge onto the DAC circuit of the first stage; sample the noise charge; load an output of the first ADC circuit of the first stage onto the DAC circuit of the first stage to generate a residue charge; sample the combination of the noise charge and the residue charge; and subtract the sampled noise charge from the sampled combination of the noise charge and the residue charge to cancel the noise charge.

In some aspects, this disclosure is direct to a pipelined analog-to-digital converter (ADC) circuit for performing correlated double sampling. The circuit comprises a first ADC circuit of a first stage of the pipelined ADC circuit; a digital-to-analog converter (DAC) circuit coupled to an output of the first ADC; and a control circuit. The control circuit is configured to control operation of a plurality of switches to: couple an analog input signal onto an ADC circuit of a first stage of the pipelined ADC circuit; load an output of the first ADC circuit of the first stage onto the DAC circuit of the first stage; open a switch to decouple the DAC circuit of the first stage from a bias voltage, the opening resulting in a noise charge onto the DAC circuit of the first stage; sample the noise charge; couple the analog signal onto the DAC circuit of the first stage to generate a residue charge; sample the combination of the noise charge and the residue charge; and subtract the sampled noise charge from the sampled combination of the noise charge and the residue charge to cancel the noise charge.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Various analog-to-digital converter (ADC) topologies exist, including delta-sigma, successive approximation register (SAR), flash, and pipelined converters. In a pipelined ADC topology, the circuit is divided into two or more stages, where each stage includes an ADC responsible for processing a portion of the result.

Figure 1:
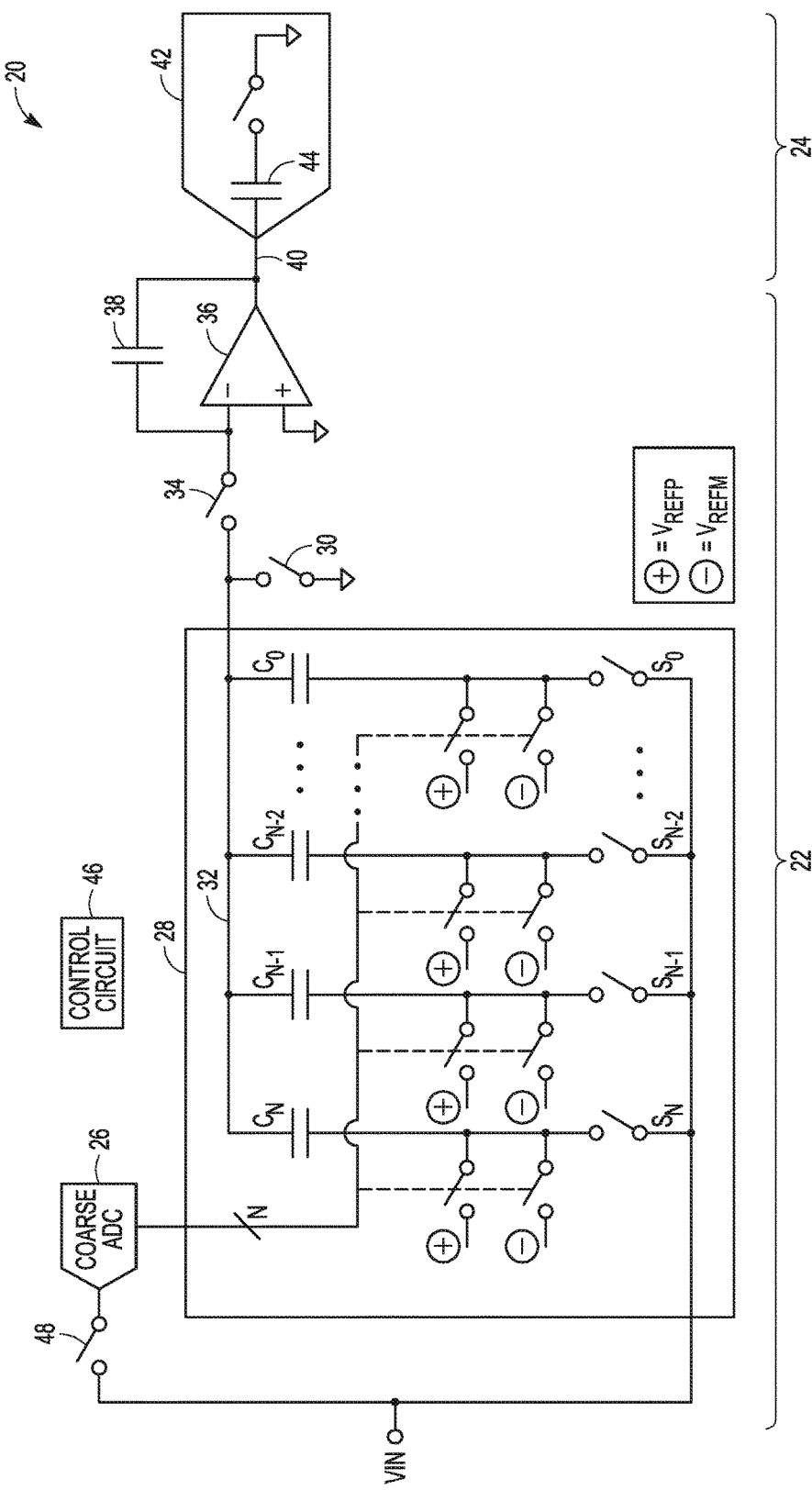
FIG. 1 is a simplified schematic diagram of an example of a pipelined ADC circuit.

FIG. 1 is a simplified schematic diagram of an example of a pipelined ADC circuit. The pipelined ADC circuit 20 can include at least a first stage 22 and a second stage 24. The first stage can include a first ADC circuit 26 configured to generate an N-bit digital output that represents an analog input signal Vin.

The N-bit output of the first ADC circuit can be coupled to an N-bit digital-to-analog converter (DAC) circuit 28 of the first stage. In some examples, the DAC circuit 28 can be a capacitor DAC and can include an array of capacitors $C_N$-$C_0$, e.g., binary weighted capacitors, that can each be coupled to receive the input voltage Vin, and can be coupled to either a positive reference voltage Vrefp or a negative reference voltage Vrefm. As depicted in FIG. 1, the top plates of the capacitors $C_N$-$C_0$ can be coupled to a bias voltage via top plate switch 30 and the bottom plates of the capacitors $C_N$-$C_0$ can be coupled to analog input voltage Vin using switches $S_N$-$S_0$, or to a positive reference voltage Vrefp or a negative reference voltage Vrefm using various other switches shown. In this disclosure, the terms "top plates" and "bottom plates" are used for convenience in describing the figures and are not meant to imply that there is any required spatial orientation for the capacitors. Further, the switches referred to in this disclosure include transistors and, in particular, can include complementary metal-oxide-semiconductor (CMOS) transistors due to their high performance and yield.

A common terminal 32 of the DAC circuit 28 can be coupled via switch 34 to a residue amplifier circuit 36 (also referred to in this disclosure as an "amplifier circuit"). Using a feedback capacitor 38, the output 40 of the amplifier circuit 36 can be coupled to the inverting input of the amplifier circuit 36. The output 40 of the amplifier circuit 36 can be coupled to another ADC circuit 42, e.g., of the second stage 24, having one or more capacitors 44, e.g., a capacitor DAC circuit.

In operation, when a control circuit 46 closes switch 48, the first ADC circuit 26 can receive the analog input signal Vin. When the control circuit 46 closes the top plate switch 30 and closes switches $S_N$-$S_0$, the capacitors $C_N$-$C_0$ of the DAC circuit 28 can also receive the analog input signal Vin. The first ADC circuit 26 samples the input and at the same time switch 30 opens, the first ADC circuit 26 samples Vin across capacitors $C_N$-$C_0$.

Then, the first ADC circuit 26 can perform a conversion on the sampled Vin. The control circuit 46 can load the N-bit output of the first ADC circuit 26 onto the DAC circuit 28 by controlling various switches of DAC circuit 28 to disconnect Vin and couple voltage references Vrefp or Vrefm to the bottom plates of the capacitors $C_N$-$C_0$ based on the N-bit output of the first ADC circuit, which can represent the most significant bits (MSBs). When the N-bit output of the first ADC circuit 26 is loaded onto the capacitors of the DAC circuit 28, a "residue" charge results that is the difference between the N-bit approximation of the charge of the analog input signal Vin produced by the first ADC 26 and the actual charge of the analog input signal Vin that was sampled on the capacitors $C_N$-$C_0$ of the DAC circuit 28.

The control circuit 46 can close switch 34 to transfer the residue charge on the common terminal 32 to an ADC circuit 42 of the second stage 24, which can sample the residue charge. Prior to the transfer, the residue charge can be amplified using the amplifier circuit 36. The ADC circuit 42 of the second stage can perform an analog-to-digital conversion on the sampled residue to determine the remaining bits (for a 2-stage pipelined ADC) or a portion of the remaining bits (for a pipelined ADC with more than 2 stages). In some example configurations; the second stage 24 can determine the least significant bits (LSBs) from the residue.

To generate the overall digital output, the control circuit 46 can also control switching to load the N-bit output of the first stage, representing the first group of bits of the overall digital output, and an M-bit output of the second stage, representing the second group of bits of the overall digital output, into an encoder (not depicted) to generate a digital output representing the analog input signal Vin.

Noise sources in a pipelined ADC circuit such as in FIG. 1 can include: 1) the initial kT/C sampling noise from a capacitor DAC circuit; 2) residue amplifier autozero sampling noise; and 3) residue amplifier output sampling noise. The kT/C sampling noise is inversely proportional to the size of the sampling capacitors; the larger sampling capacitors produce less noise. However, larger sampling capacitor can be difficult to drive and physically occupy significant die area.

By using various techniques of this disclosure, the inversely proportional relationship between the sampling noise and the size of the sampling capacitors is no longer true. The size of the sampling capacitors can be greatly reduced, which can reduce the die area and reduce the power consumption of the ADC, and the kT/C sampling noise can be canceled using correlated double sampling (CDS) techniques.

Figure 2A:
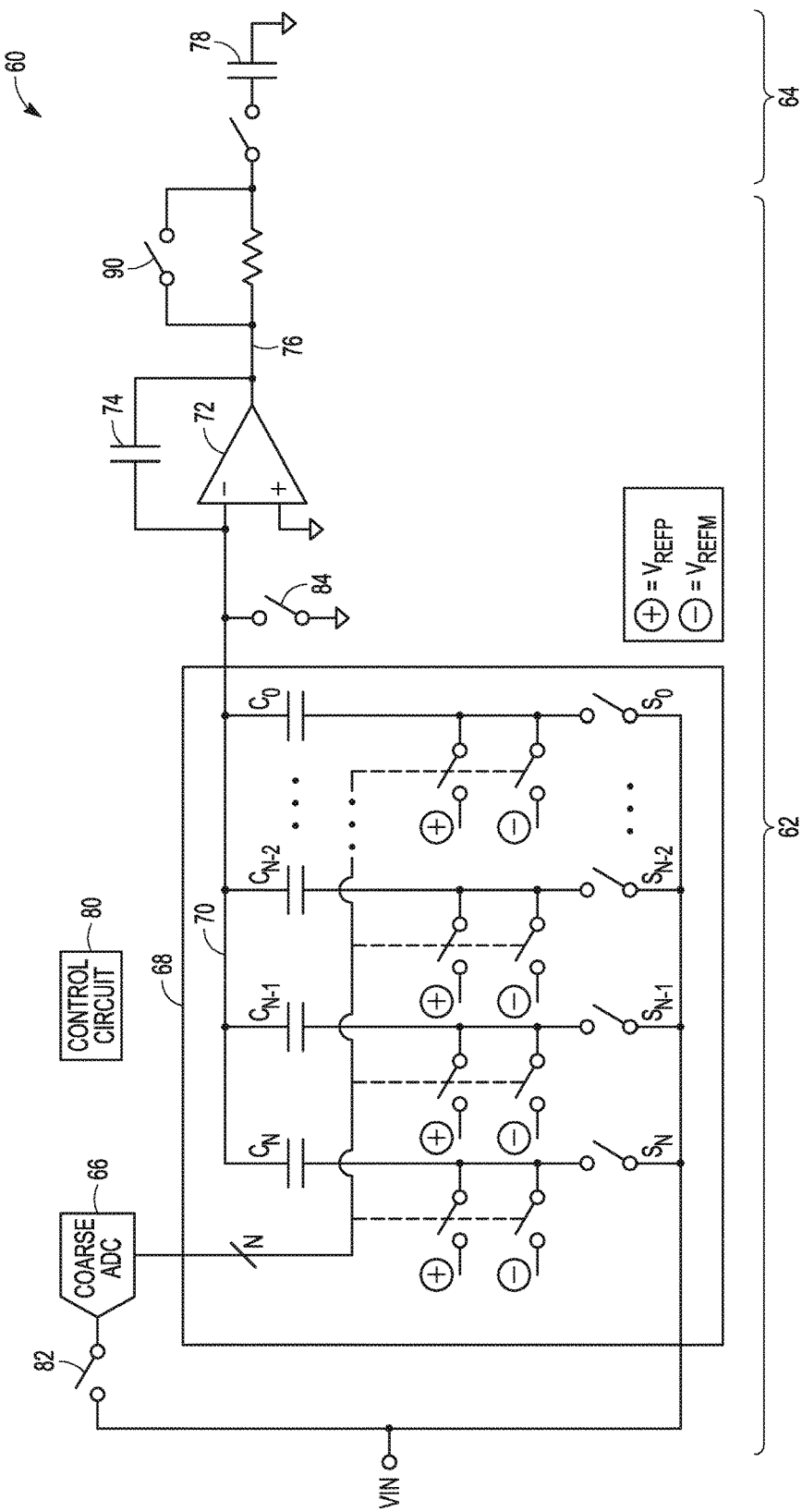
FIG. 2A is a simplified schematic diagram of an example of a pipelined ADC circuit that can implement various techniques of this disclosure.

FIG. 2A is a simplified schematic diagram of an example of a pipelined ADC circuit that can implement various techniques of this disclosure. The pipelined ADC circuit 60 of FIG. 2A can include at least a first stage 62 and a second stage 64. The first stage can include a first ADC circuit 66 configured to generate an N-bit digital output that represents an analog input signal Vin. For example, the first ADC circuit 66 can generate an 8-bit output for an ADC circuit 60 that has an overall 16-bit resolution (with the remaining 8 bits to be generated by one or more subsequent stages).

In some example configurations, the first ADC circuit 66 can be a coarse ADC. A coarse ADC can help convert higher input voltage ranges using a low voltage supply and can allow the ADC to power down a residue amplifier circuit 72 during the acquisition phase and provide auto zeroing during the coarse ADC conversion. The results of the coarse ADC can be loaded onto the DAC circuit 68. In some examples, the first ADC circuit 66 can include a successive approximation register (SAR) topology. In some examples, the first ADC circuit 66 can be a SAR coarse ADC. In other examples, the first ADC circuit 66 can be a flash ADC.

SAR ADC operation is known to those of ordinary skill in the art. An example SAR ADC is described in commonly assigned U.S. Pat. No. 7,432,844 to Mueck et al. and titled "DIFFERENTIAL INPUT SUCCESSIVE APPROXIMATION ANALOG TO DIGITAL CONVERTER WITH COMMON MODE REJECTION," the entire contents of which being incorporated herein by reference. In some examples, the first ADC circuit 66 can provide a coarse resolution and thus be low power. Provided that the remaining circuitry has sufficient range, any errors that result from the noisy first ADC circuit 66 can be canceled.

The N-bit output of the first ADC circuit 66 can be coupled to the DAC circuit 68 of the first stage. The DAC circuit 68 of FIG. 2A can be similar to the DAC circuit 28 of FIG. 1 and, for purposes of conciseness, will not be described in detail again.

A common terminal 70 of the DAC circuit 68 can be coupled to a residue amplifier circuit 72 (also referred to in this disclosure as an "amplifier circuit"). Using a feedback capacitor 74, the output 76 of the amplifier circuit 72 can be coupled to the inverting input of the amplifier circuit 72. The output 76 of the amplifier circuit 72 can be coupled to another ADC circuit 78 of the second stage 64.

During a first stage of the operation of the ADC circuit 60, when a control circuit 80 closes switch 82, the ADC circuit 60 of FIG. 2A can couple the analog input signal Vin onto the first ADC circuit 66, and when the control circuit closes the top plate switch 84 and switches $S_N$-$S_0$, the ADC circuit 60 of FIG. 2A can couple the analog input signal Vin onto the bottom plates of the capacitors $C_N$-$C_0$ of the DAC circuit 68. The next phase is shown in FIG. 2B.

Figure 2B:
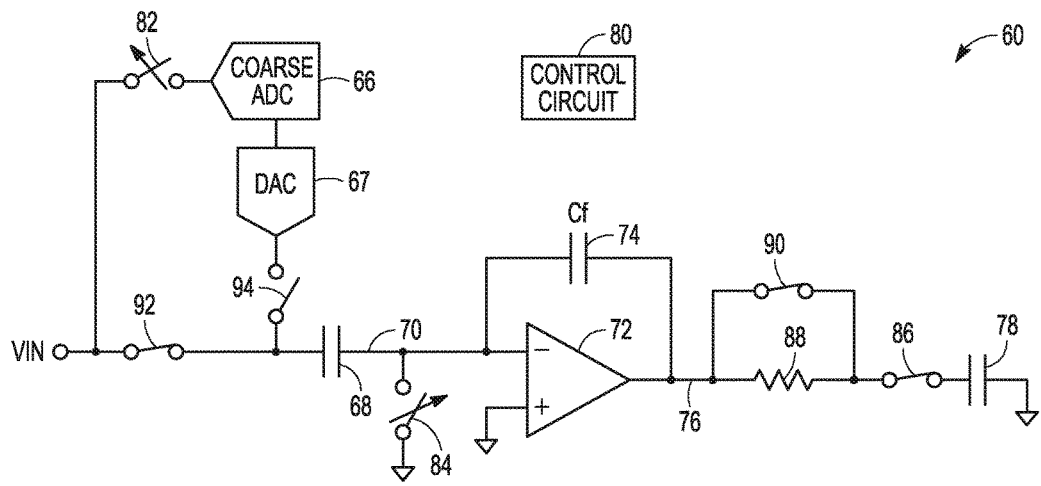
FIG. 2B is a simplified schematic diagram of the pipelined ADC circuit of FIG. 2A in another phase of an analog-to-digital conversion process.

FIG. 2B is a simplified schematic diagram of the pipelined ADC circuit of FIG. 2A in another phase of an analog-to-digital conversion process. In this phase of the conversion process, the control circuit 80 can open the top plate switch 84 to decouple the common terminal 70 of the DAC circuit 68 (and thus the top plates of the capacitors $C_N$-$C_0$ of the DAC circuit 68) of the first stage from a bias voltage, e.g., ground or a common mode voltage. For simplicity, the DAC circuit 68 of FIG. 2A is represented in FIG. 2B (and onward) by a single capacitor 68 and a DAC circuit 67, where the DAC circuit 67 receives the output from the coarse ADC 66 and produces an equivalent analog voltage at its output. That is, the capacitor array in FIG. 2A that performs the DAC function by connecting various unit capacitors to Vrefp/Vrefm is depicted by single capacitor 68 and a separate DAC circuit 67 as shown in FIG. 2B.

The opening of the top plate switch 84 freezes a noise charge onto the common terminal 70 of the DAC circuit 68 of the first stage and any parasitic capacitance on the amplifier circuit 72. The noise charge is transferred to the output 76 of the amplifier circuit 72 via the feedback capacitor 74. In some example implementations, it can be desirable to amplify the noise charge prior to sampling the noise charge. The next phase is shown in FIG. 2C.

Figure 2C:
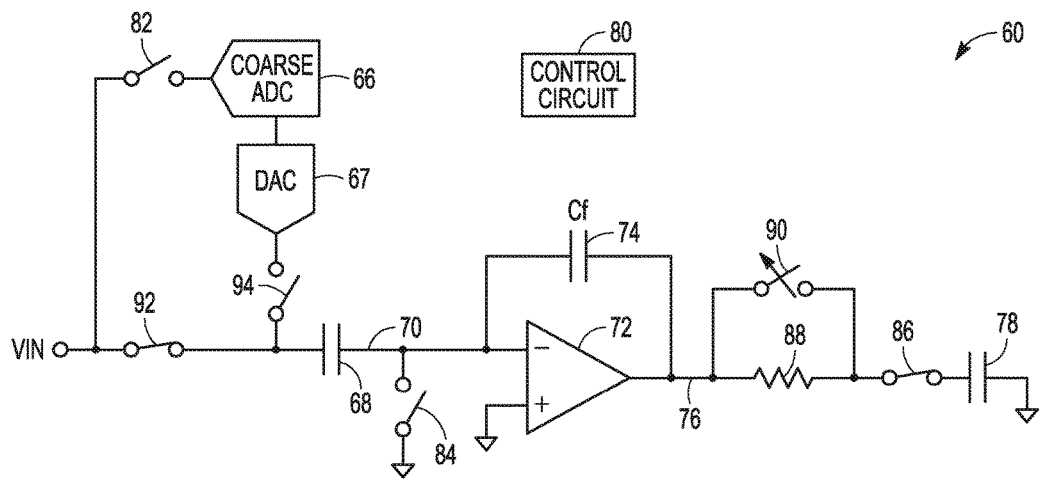
FIG. 2C is a simplified schematic diagram of the pipelined ADC circuit of FIG. 2A in another phase of an analog-to-digital conversion process.

FIG. 2C is a simplified schematic diagram of the pipelined ADC circuit of FIG. 2A in another phase of an analog-to-digital conversion process. In this optional phase of the conversion process, the noise charge can be filtered, e.g., using a dynamic filter. As shown in FIG. 2C, the ADC circuit 60 can include a dynamic filter that can include a resistive component 88, and a bypass switch 90 to bypass the resistive component 88. To reduce the noise sampled onto one or more capacitors, e.g., capacitor DAC circuit 78 of the second stage, the resistive component 88 can initially be bypassed when switch 90 is closed, which can allow a voltage to quickly settle onto the capacitor DAC circuit 78. Once the voltage has settled, the control circuit 80 can open switch 90 thereby placing the resistive component 88 in series with the capacitor DAC circuit 78, which can band limit the noise. The next phase is shown in FIG. 2D.

Figure 2D:
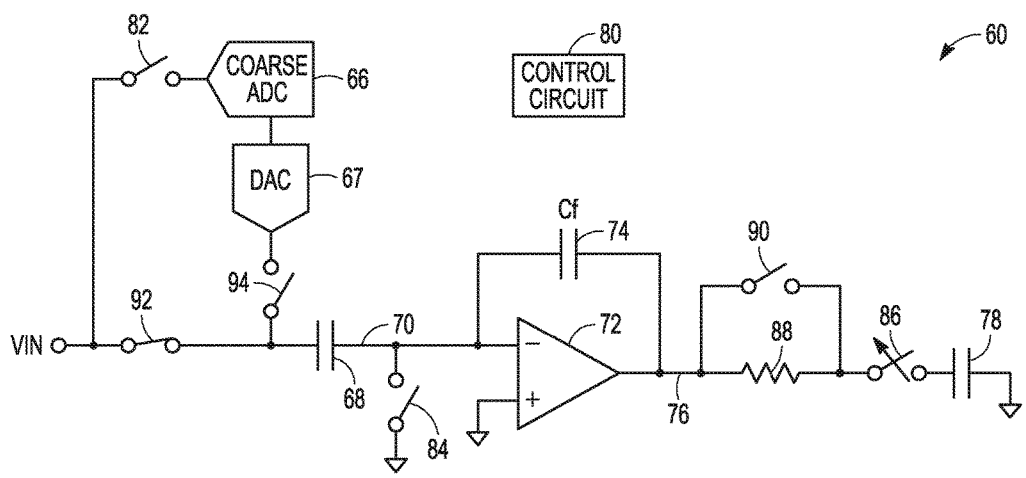
FIG. 2D is a simplified schematic diagram of the pipelined ADC circuit of FIG. 2A in another phase of an analog-to-digital conversion process.

FIG. 2D is a simplified schematic diagram of the pipelined ADC circuit of FIG. 2A in another phase of an analog-to-digital conversion process. In FIG. 2D, the control circuit 80 can open switch 86 to take a first sample. The first sample can include the noise charge that was sampled when the top plate switch 84 was opened and can include any change in the input voltage Vin that may have occurred between the opening of the top plate switch 84 and switch 86.

The control circuit 80 can control a sampling of the noise charge by opening switch 86 to sample the noise charge onto a capacitor. For example, the noise charge can be sampled onto a DAC circuit 78 of the second stage 62, where the DAC circuit 78 is represented by a single capacitor for simplicity. In some examples, the DAC circuit 78 of the second stage can be a capacitor DAC circuit.

During the stages shown in FIGS. 2A-2D, the first ADC circuit 66 has performed a conversion on the sampled input voltage Vin. The next phase is shown in FIG. 2E.

Figure 2E:
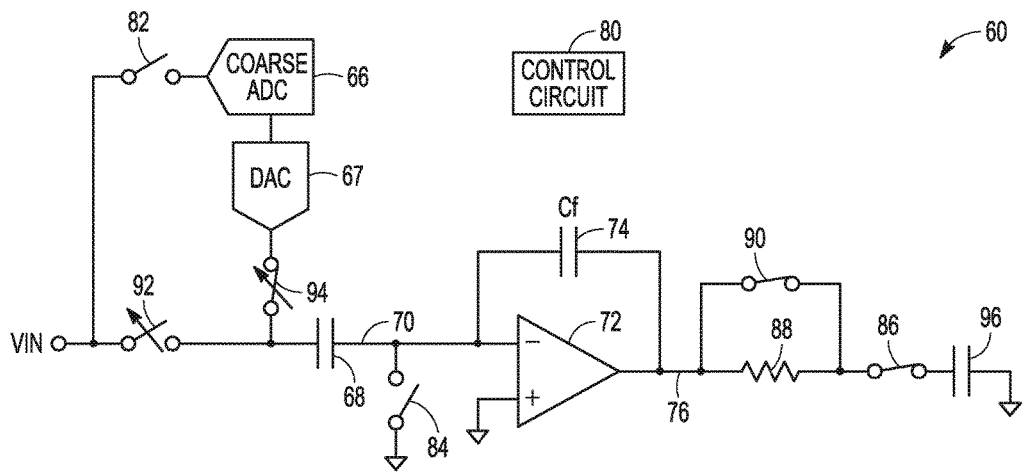
FIG. 2E is a simplified schematic diagram of the pipelined. ADC circuit of FIG. 2A in another phase of an analog-to-digital conversion process.

FIG. 2E is a simplified schematic diagram of the pipelined ADC circuit of FIG. 2A in another phase of an analog-todigital conversion process. In FIG. 2E, the control circuit 80 can open switch 92, close switch 94, and connect bottom plates of the DAC circuit 68 to reference voltages Vrefp or Vrefm to load the N-bit output of the first ADC circuit 66 of the first stage onto the DAC circuit 68 of the first stage. It should be noted that switches 92 and 94 are depicted for conceptual purposes and exists within DAC circuit 68 as a multitude of switches. The output of the first ADC circuit is an N-bit approximation of the sampled input voltage Vin. When loaded onto the DAC circuit 68 of the first stage, which previously stored the exact input voltage Vin, a residue charge is generated on the common terminal 70. The residue charge is transferred to the output 76 of the amplifier circuit 72 via the feedback capacitor 74. The noise charge is still present at the output 76 from a previous phase. In some examples configurations, the residue charge can be amplified by the amplifier circuit 72 prior to sampling the combination of the residue charge and the noise charge.

Then, the control circuit 80 can control a sampling of a combination of the residue charge and the noise charge. For example, the control circuit 80 can close switch 86 to sample the combination of the residue charge and the noise charge onto a capacitor. For example, the combination of the residue charge and the noise charge can be sampled onto another DAC circuit 96 of the second stage, where the DAC circuit 96 is represented by a single capacitor for simplicity. In some examples, the DAC circuit 96 of the second stage can be a capacitor DAC circuit. The next phase is shown in FIG. 2F.

Figure 2F:
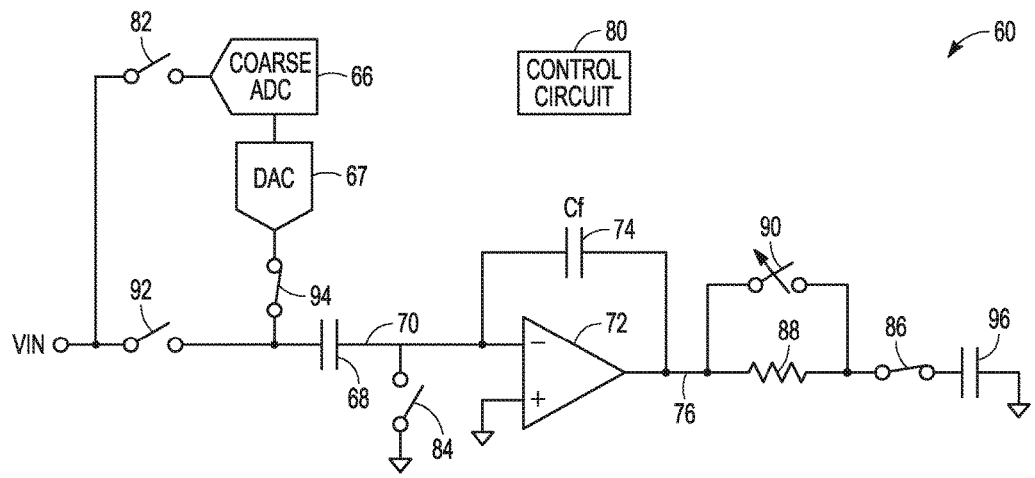
FIG. 2F is a simplified schematic diagram of the pipelined ADC circuit of FIG. 2A in another phase of an analog-to-digital conversion process.

FIG. 2F is a simplified schematic diagram of the pipelined ADC circuit of FIG. 2A in another phase of an analog-to-digital conversion process. In this optional phase of the conversion process, the noise charge can be filtered, as described above with respect to FIG. 2C. To reduce the noise sampled onto one or more capacitors, e.g., capacitor DAC circuit 96 of the second stage, the resistive component 88 can initially be bypassed when switch 90 is closed, which can allow a voltage to quickly settle onto the capacitor DAC circuit 96. Once the voltage has settled, the control circuit 80 can open switch 90 thereby placing the resistive component 88 in series with the capacitor DAC circuit 96, which can band limit the noise. The next phase is shown in FIG. 2G.

Figure 2G:
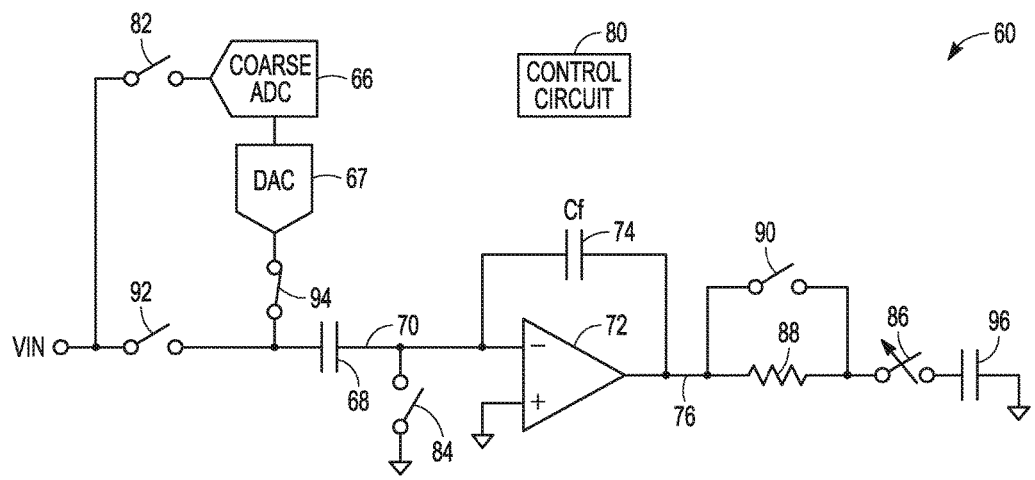
FIG. 2G is a simplified schematic diagram of the pipelined ADC circuit of FIG. 2A in another phase of an analog-to-digital conversion process.

FIG. 2G is a simplified schematic diagram of the pipelined ADC circuit of FIG. 2A in another phase of an analog-to-digital conversion process. In FIG. 2G, the control circuit 80 can open switch 86 to take a second sample. The second sample on DAC circuit 96 can include the residue charge and the noise charge.

To cancel the noise charge, the control circuit 80 can control a subtraction of the sampled noise charge on DAC circuit 78 of the second stage from the sampled combination of the noise charge and the residue charge on DAC circuit 96 of the second stage. Although described with respect to analog techniques, the ADC circuit 60 can perform the subtraction using digital techniques in some example implementations. In this manner, correlated double sampling is achieved.

An alternative approach to reducing or eliminating the kT/C sampling noise and the residue amplifier sampling noise in a pipelined ADC circuit is described below with respect to FIGS. 3A-3H. The components of the pipelined circuit described in FIGS. 3A-3H are similar to those described in FIGS. 2A-2G and, as such, similar reference numbers will be used.

Figure 3A:
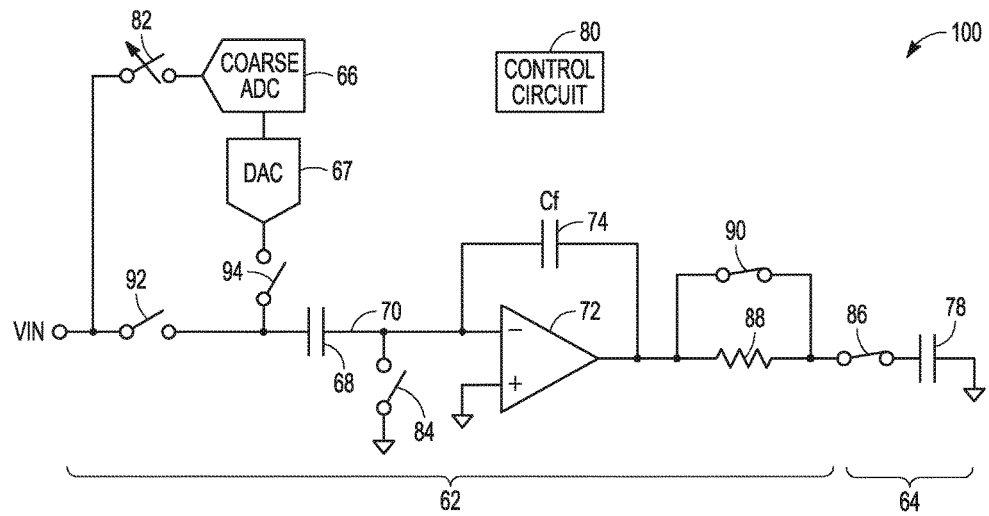
FIG. 3A is a simplified schematic diagram of an example of a pipelined ADC circuit that can implement various techniques of this disclosure.

FIG. 3A is a simplified schematic diagram of an example of a pipelined ADC circuit that can implement various techniques of this disclosure. The pipelined ADC circuit 100 of FIG. 3A can include at least a first stage 62 and a second stage 64. The first stage can include a first ADC circuit 66 configured to generate an N-bit digital output that represents an analog input signal Vin. In some example configurations, the first ADC circuit 66 can be a coarse ADC. The N-bit output of the first ADC circuit 66 can be coupled to the DAC circuit 68 of the first stage. The DAC circuit 68 of FIG. 3A can be similar to the DAC circuit 28 of FIG. 1 and, for purposes of conciseness, will not be described in detail again. As before, for simplicity, the capacitors of the DAC circuit 68 in FIG. 3A are represented by a single capacitor 68.

During a first stage of the operation of the ADC circuit 100, when the control circuit 80 closes switch 82, the ADC circuit 100 of FIG. 3A can couple the analog input signal Vin onto the first ADC circuit 66. The control circuit 80 can open switch 82 and the first ADC circuit 66 can perform a conversion to generate the first bits of a digital output. The next phase is shown in FIG. 3B.

Figure 3B:
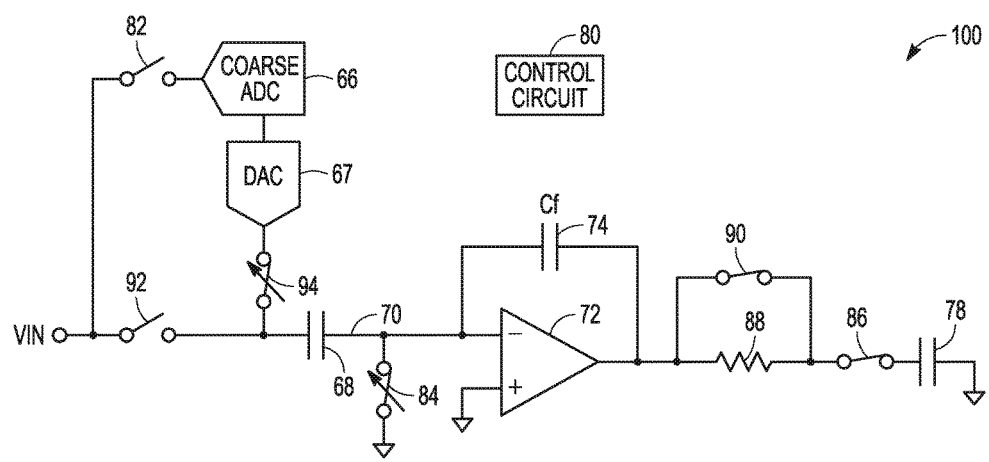
FIG. 3B is a simplified schematic diagram of the pipelined ADC circuit of FIG. 3A in another phase of an analog-to-digital conversion process.

FIG. 3B is a simplified schematic diagram of the pipelined ADC circuit of FIG. 3A in another phase of an analog-to-digital conversion process. In FIG. 3B, to load an N-bit output of the first ADC circuit 26 onto the DAC circuit 68, the control circuit 80 can close the top plate switch 84 to couple the top plates of the capacitors $C_N$-$C_0$ of the DAC circuit 68 (shown in FIG. 2A) to a bias voltage, e.g., ground or a common mode voltage, and can control various switches of the DAC circuit 68 to couple voltage references Vrefp or Vrefm to the bottom plates of the capacitors $C_N$-$C_0$ based on the output of the first ADC circuit. In this manner, an N-bit approximation of the sampled analog input signal Vin is loaded onto the DAC circuit 68.

Figure 3C:
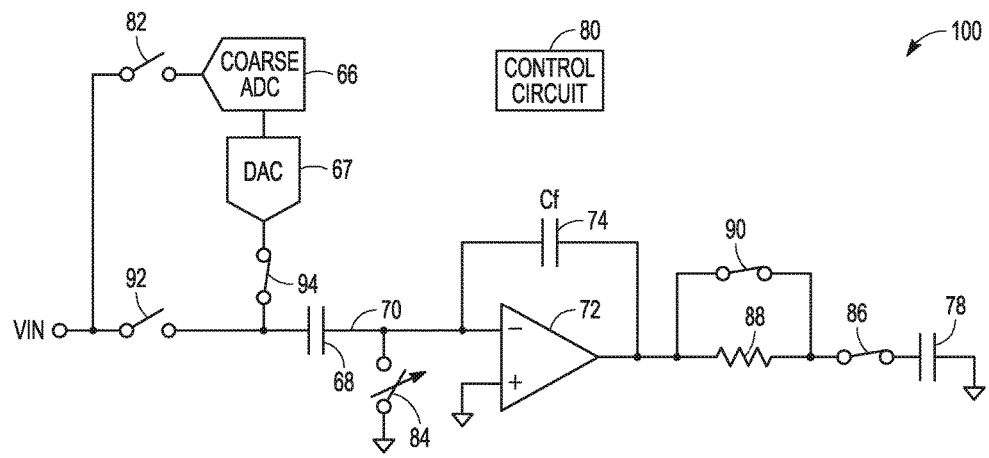
FIG. 3C is a simplified schematic diagram of the pipelined ADC circuit of FIG. 3A in another phase of an analog-to-digital conversion process.

In addition, the residue amplifier 72 can be powering up and performing an auto-zeroing process so that it can be ready for the next phase, which is shown in FIG. 3C. In some example implementations, the residue amplifier 72 can sample noise during the auto-zeroing process.

FIG. 3C is a simplified schematic diagram of the pipelined ADC circuit of FIG. 3A in another phase of an analog-to-digital conversion process. In this phase of the conversion process, the control circuit 80 can open the top plate switch 84 to decouple the common terminal 70 of the DAC circuit 68 (and thus the top plates of the capacitors $C_N$-$C_0$ of the DAC circuit 68) of the first stage from a bias voltage, e.g., ground or a common mode voltage.

The opening of the top plate switch 84 freezes a noise charge onto the common terminal 70 of the DAC circuit 68 of the first stage and any parasitic capacitance on the amplifier circuit 72. The amplifier circuit attempts to maintain the virtual ground at its inverting terminal and transfers the noise charge to the output 76 of the amplifier circuit 72 via the feedback capacitor 74. In some example implementations, it can be desirable to amplify the noise charge prior to sampling the noise charge, e.g., using a gain greater than one.

Then, the control circuit 80 can control a sampling of the noise charge. For example, the control circuit 80 can close switch 86 to sample the noise charge (and any remaining offsets) onto a capacitor. For example, the noise charge can be sampled onto a DAC circuit 78 of the second stage 62, where the DAC circuit 78 is represented by a single capacitor for simplicity. In some examples, the DAC circuit 78 of the second stage can be a capacitor DAC circuit. The next phase is shown in FIG. 3D.

Figure 3D:
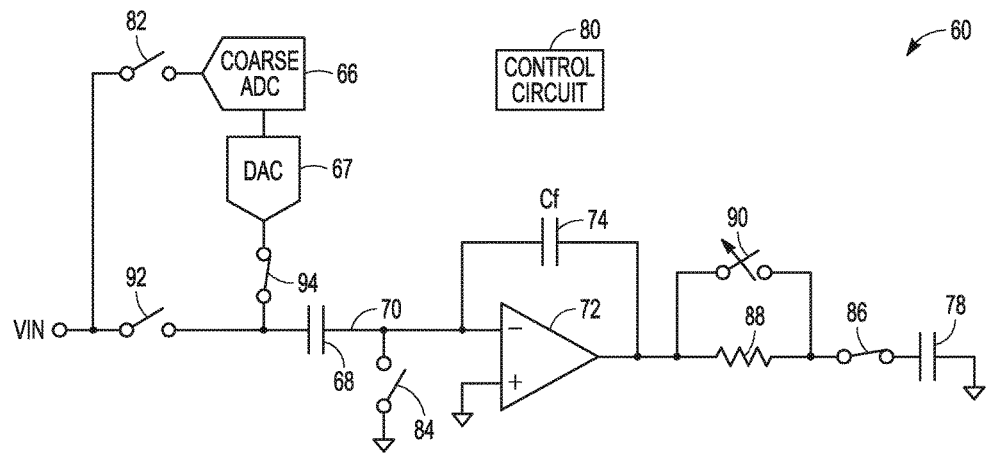
FIG. 3D is a simplified schematic diagram of the pipelined ADC circuit of FIG. 3A in another phase of an analog-to-digital conversion process.

FIG. 3D is a simplified schematic diagram of the pipelined ADC circuit of FIG. 3A in another phase of an analog-to-digital conversion process. In this optional phase of the conversion process, the noise charge can be filtered, e.g., using a dynamic filter. As shown in FIG. 3D, the ADC circuit 60 can include a dynamic filter that includes a resistive component 88 and a bypass switch 90 to bypass the resistive component 88. To reduce the noise sampled onto one or more capacitors, e.g., capacitor DAC circuit 78 of the second stage, the resistive component 88 can initially be bypassed when switch 90 is closed, which can allow a voltage to quickly settle onto the capacitor DAC circuit 78. Once the voltage has settled, the control circuit 80 can open switch 90 thereby placing the resistive component 88 in series with the capacitor DAC circuit 78, which can band limit the noise. The next phase is shown in FIG. 3E.

Figure 3E:
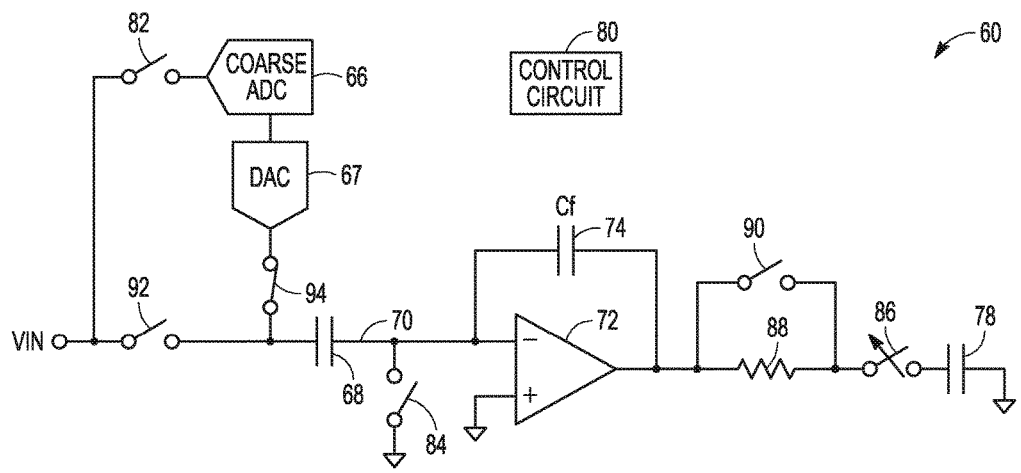
FIG. 3E is a simplified schematic diagram of the pipelined. ADC circuit of FIG. 3A in another phase of an analog-to-digital conversion process.

FIG. 3E is a simplified schematic diagram of the pipelined ADC circuit of FIG. 3A in another phase of an analog-to-digital conversion process. In FIG. 3E, the control circuit 80 can open switch 86 to take a first sample. The first sample can include the noise charge that was sampled when the top plate switch 84 was opened. The next phase is shown in FIG. 3F.

Figure 3F:
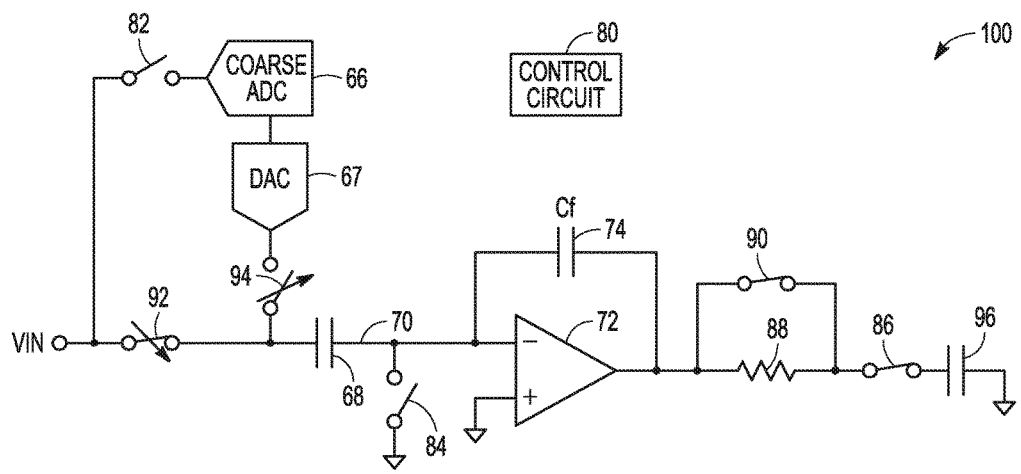
FIG. 3F is a simplified schematic diagram of the pipelined ADC circuit of FIG. 3A in another phase of an analog-to-digital conversion process.

FIG. 3F is a simplified schematic diagram of the pipelined ADC circuit of FIG. 3A in another phase of an analog-to-digital conversion process. In FIG. 3F, the control circuit 80 closes switch 86, opens switch 94 to decouple the output of the first ADC circuit 66 from the DAC circuit 68, and closes switch 92 and switches $S_N$-$S_0$ of FIG. 2A to couple the analog input signal Vin to the bottom plates of the DAC circuit 68.

This operation moves the charge on the DAC circuit 68 from the N-bit approximation of the sampled analog input signal Vin to the exact analog input signal Vin. This movement results in a residue charge on the common terminal 70 of the DAC circuit 68, which is the difference between the N-bit approximation of the sampled analog input signal Vin and the exact analog input signal Vin.

The amplifier circuit 72 transfers the residue charge to the output 76 of via the feedback capacitor 74. The noise charge is still present at the output 76 from when it was transferred during a previous phase. In some example configurations, the residue charge can be amplified by the amplifier circuit 72 prior to sampling the combination of the residue charge and the noise charge. The next phase is shown in FIG. 3G.

Figure 3G:
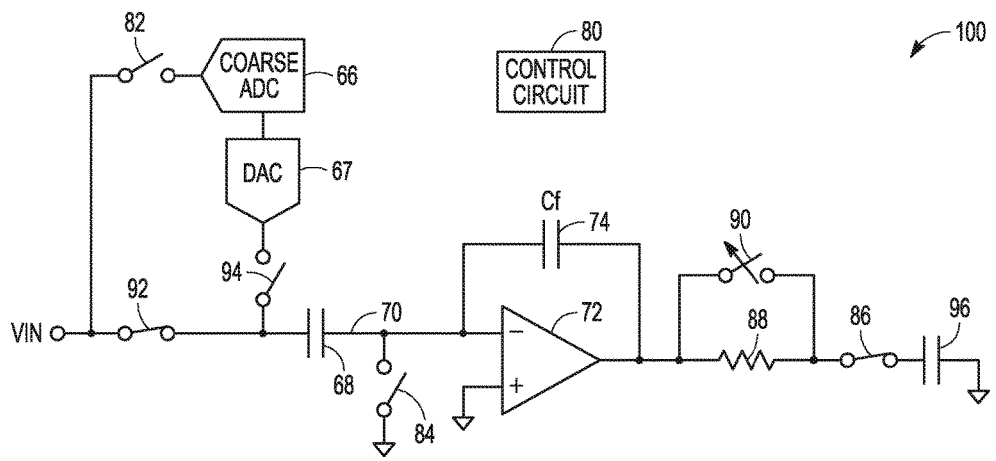
FIG. 3G is a simplified schematic diagram of the pipelined ADC circuit of FIG. 3A in another phase of an analog-to-digital conversion process.

FIG. 3G is a simplified schematic diagram of the pipelined ADC circuit of FIG. 3A in another phase of an analog-to-digital conversion process. In this optional phase of the conversion process, the noise charge can be filtered, as described above, by initially bypassing the resistive component 88 and then opening switch 90. The next phase is shown in FIG. 3H.

Figure 3H:
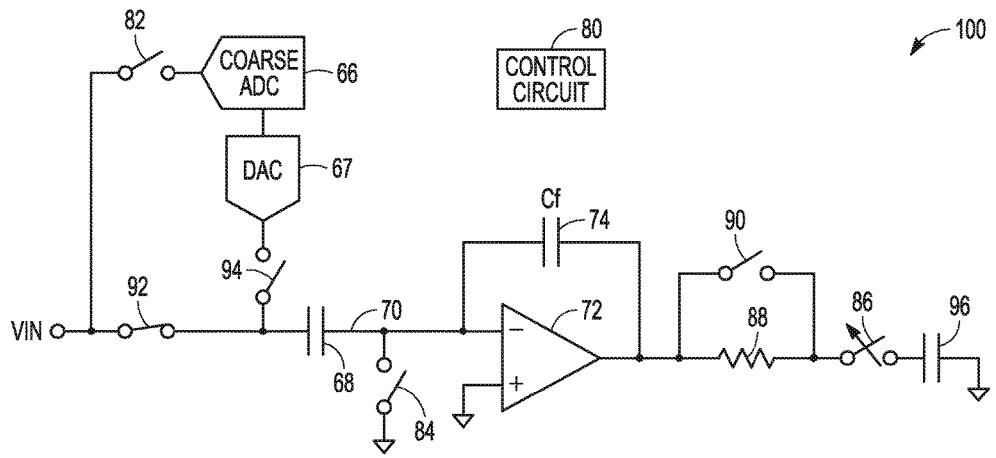
FIG. 3H is a simplified schematic diagram of the pipelined ADC circuit of FIG. 3A in another phase of an analog-to-digital conversion process.

FIG. 3H is a simplified schematic diagram of the pipelined ADC circuit of FIG. 3A in another phase of an analog-to-digital conversion process. In FIG. 3H, the control circuit 80 can open switch 86 to take a second sample. The second sample on DAC circuit 96 can include the residue charge and the noise charge.

The control circuit 80 can control a sampling of a combination of the residue charge and the noise charge by opening switch 86 to sample the combination of the residue charge and the noise charge onto a capacitor. For example, the combination of the residue charge and the noise charge can be sampled onto another DAC circuit 96 of the second stage, where the DAC circuit 96 is represented by a single capacitor for simplicity. In some examples, the DAC circuit 96 of the second stage can be a capacitor DAC circuit.

To cancel the noise charge, e.g., the kT/C noise charge, any offsets and auto-zeroing noise, the control circuit 80 can control a subtraction of the sampled noise charge on the DAC circuit 78 of the second stage from the sampled combination of the noise charge and the residue charge on the DAC circuit 96 of the second stage. Although described with respect to analog techniques, the ADC circuit 90 can perform the subtraction using digital techniques in some example implementations. In this manner, correlated double sampling is achieved.

Various techniques of this disclosure were described above using single-ended configurations. However, the techniques of this disclosure can be performed using a differential configuration, an example of which is shown in FIG. 4.

Figure 4:
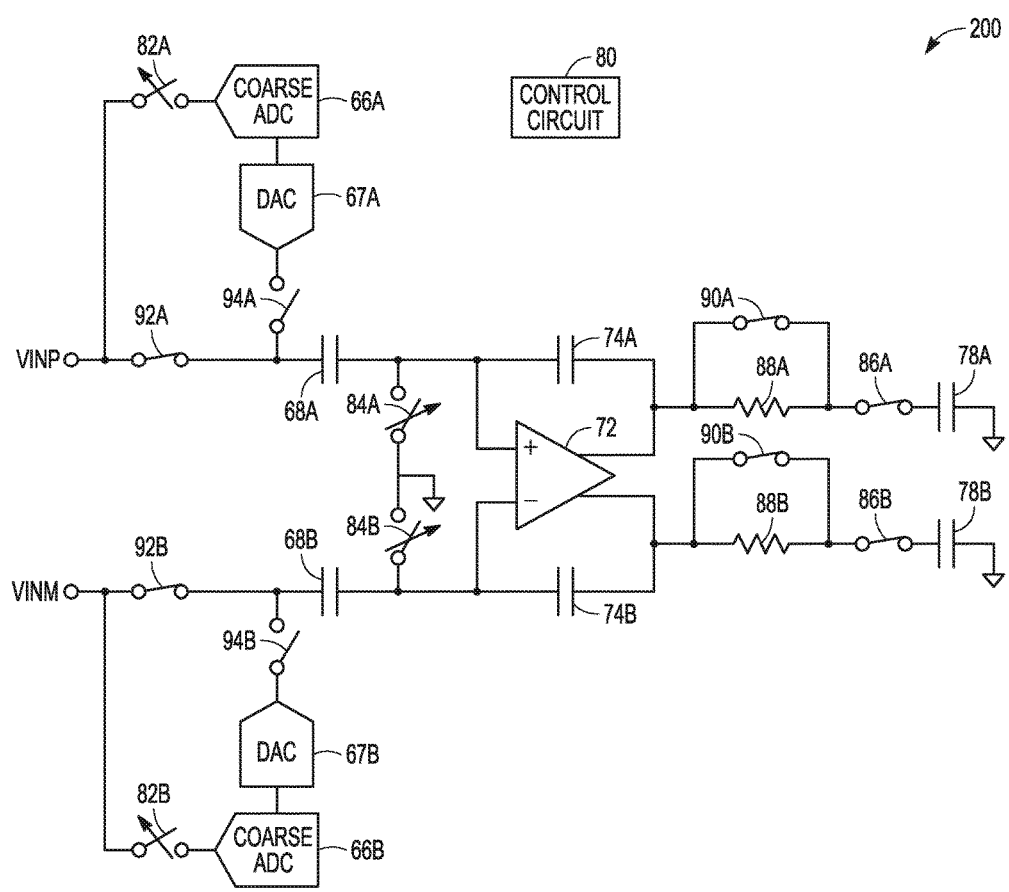
FIG. 4 is a simplified schematic diagram of an example of a pipelined ADC circuit in a differential configuration that can implement various techniques of this disclosure.

FIG. 4 is a simplified schematic diagram of an example of a pipelined ADC circuit in a differential configuration that can implement various techniques of this disclosure. The differential configuration depicted in FIG. 4 can perform the techniques described above with respect to FIGS. 2A-2G and FIGS. 3A-3H. Reference numbers are similar to those used above with respect to FIGS. 2A-2G and FIGS. 3A-3H have been used in FIG. 4, with the addition of either an "A" or a "B" to the reference numbers to distinguish between the two complementary portions of the differential configuration. The pipelined ADC circuit 200 of FIG. 4 is configured to couple differential analog input signals Vinp (e.g., positive) and Vinm (e.g., negative), as shown, onto a top portion and a bottom portion, respectively, using switches 82A, 92A and 829, 92B.

The techniques described in this disclosure can have various advantages. For example, the pipelined ADC techniques can eliminate any residue amplifier offset and sampling kT/C noise, which can result in smaller transconductance (gm), smaller capacitors in the DAC circuits, e.g., DAC circuit 68, and thus lower power. Another advantage is that these techniques can provide filtering to the driver noise because filtering (the optional filtering phases described above) occurs during the residue amplifier operation.

In addition, because only the residue amplifier needs accurate input, the techniques above can allow the first ADC circuit 66 to be a coarse resolution ADC, which can be noisy. As such, the architecture described can allow for a power cycled driver, which can be tightly integrated with the ADC circuit.

Finally, the techniques of this disclosure can eliminate the need for right hand side (RHS) switches in the signal path during residue amplifier operation, which can yield better noise performance and lower parasitics.

Figure 5:
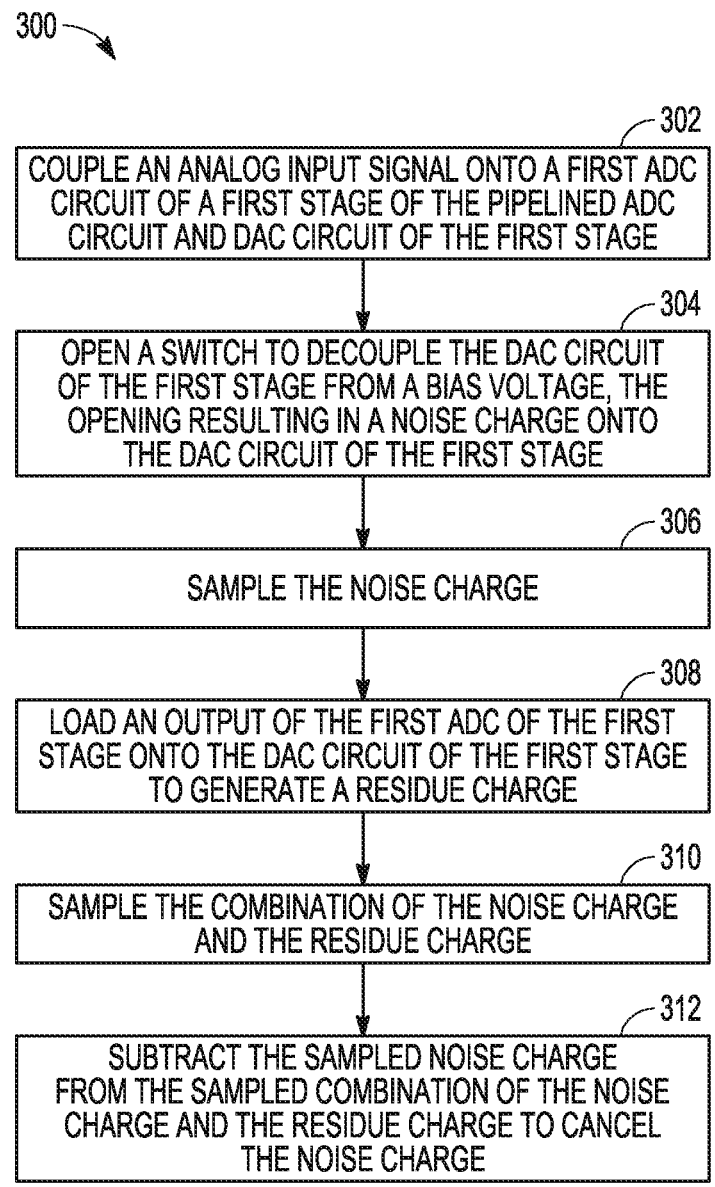
FIG. 5 is a flow diagram depicting an example of a method of operating a pipelined ADC to perform correlated double sampling.

FIG. 5 is a flow diagram depicting an example of a method 300 of operating a pipelined ADC to perform correlated double sampling. At block 302, the method can include coupling an analog input signal onto a first ADC circuit of a first stage of the pipelined ADC circuit and a digital-to-analog converter (DAC) circuit of the first stage. For example, the control circuit 80 of FIG. 2A can control switch 82 to couple analog input signal Vin onto the first ADC circuit 66, e.g., a coarse ADC, and control switches and switches $S_N$-$S_0$ to couple analog input signal Vin onto first DAC circuit 68, e.g., a capacitor DAC circuit.

At block 304, the method 300 can include opening a switch to decouple the DAC circuit of the first stage from a bias voltage, the opening resulting in a noise charge onto the DAC circuit of the first stage. For example, the control circuit 80 of FIG. 2B can open top plate switch 84 to decouple the DAC circuit 68 of the first stage 62 from a bias voltage, e.g., ground or a common-mode voltage.

At block 306, the method 300 can include sampling the noise charge. For example, the amplifier circuit 72 can transfer (and amplify) the noise charge from the common terminal 70 and the control circuit 80 can open switch 86 to sample the charge onto DAC circuit 78, as in FIG. 2D. As indicated above, in some example implementations the noise charge can be filtered using a dynamic filter prior to sampling by opening switch 90, as in FIG. 2C, after a voltage has settled.

At block 308, the method 300 can include loading an output of the first ADC circuit of the first stage onto the DAC circuit of the first stage to generate a residue charge. For example, the control circuit 80 of FIG. 2E can open switch 92, close switch 94, and close various switches to connect the bottom plates of the DAC circuit 68 to reference voltages Vrefp or Vrefm to load the output of the first ADC 66 of the first stage onto the DAC circuit 68 of the first stage, which previously stored the exact input voltage Vin, to generate a residue charge on the common terminal 70.

At block 310, the method 300 can include sampling the combination of the noise charge and the residue charge. For example, the amplifier circuit 72 can transfer (and amplify) the residue charge from the common terminal 70 and the control circuit 80 can open switch 86 to sample the residue charge and the noise charge that remains on the output 76 of the amplifier onto the DAC circuit 78, as in FIG. 2G. The noise charge can be filtered using a dynamic filter prior to sampling by opening switch 90, as in FIG. 2F, after a voltage has settled.

At block 312, the method 300 can include subtracting the sampled noise charge from the sampled combination of the noise charge and the residue charge to cancel the noise charge. For example, the control circuit 80 can control a subtraction of the sampled noise charge on DAC circuit 78 of the second stage from the sampled combination of the noise charge and the residue charge on DAC circuit 96 of the second stage. In this manner, correlated double sampling is achieved.

In some example implementations, the ADC circuit 60 of FIGS. 2A-2G can be differentially configured, such as shown in FIG. 4. Thus, the method 300 can further include coupling differential analog input signals Vinp (e.g., positive) and Vinm (e.g., negative), as shown in FIG. 4, onto a top portion and a bottom portion of the ADC circuit 200, respectively, using switches 82A, 92A and 82B, 92B.

Figure 6:
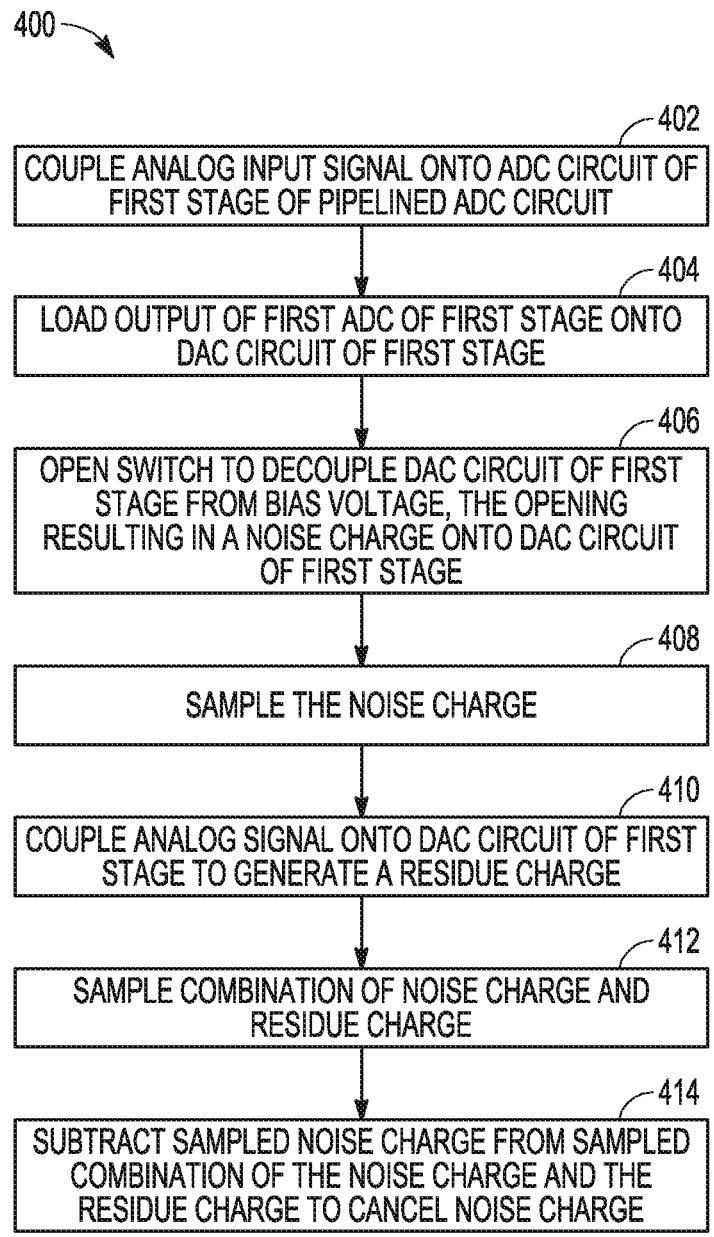
FIG. 6 is a flow diagram depicting another example of another method of operating a pipelined. ADC to perform correlated double sampling.

FIG. 6 is a flow diagram depicting another example of another method 400 of operating a pipelined ADC to perform correlated double sampling. At block 402, the method 400 can include coupling an analog input signal onto an ADC circuit of a first stage of the pipelined ADC circuit. For example, the control circuit 80 of FIG. 3A can close switch 82 to couple the analog input signal Vin onto the first ADC circuit 66. Then, the control circuit 80 can open switch 82 and the first ADC circuit 66, e.g., a coarse ADC, such as a SAR ADC, can perform a conversion on the first N bits.

At block 404, the method 400 can include loading an output of the first ADC circuit of the first stage onto the DAC circuit of the first stage. For example, the control circuit 80 of FIG. 3B can close switch 94, and close various switches to connect bottom plates of the DAC circuit 68 to reference voltages Vrefp or Vrefm to load the output of the first ADC 66 of the first stage onto the DAC circuit 68 of the first stage.

At block 406, the method 400 can include opening a switch to decouple the DAC circuit of the first stage from a bias voltage, the opening resulting in a noise charge onto the DAC circuit of the first stage. For example, the control circuit 80 of FIG. 3C can open top plate switch 84 to decouple the DAC circuit 68 of the first stage 62 from a bias voltage, e.g., ground or a common-mode voltage.

At block 408, the method 400 can include sampling the noise charge. For example, in FIG. 3E the amplifier circuit 72 can transfer (and amplify) the noise charge from the common terminal 70 and the control circuit 80 can open switch 86 to sample the charge onto DAC circuit 78. As described above, in some example implementations the noise charge can be filtered using a dynamic filter prior to sampling by opening switch 90, as in FIG. 3D, after a voltage has settled.

At block 410, the method 400 can include coupling the analog signal Vin onto the DAC circuit of the first stage to generate a residue charge. For example, the control circuit 80 of FIG. 3F can close switch 86, open switch 94 to decouple the output of the first ADC circuit 66 from the DAC circuit 68, and close switch 92 and switches $S_N$-$S_0$ (shown in FIG. 2A) to couple the analog input signal Vin to the bottom plates of the DAC circuit 68. The DAC circuit 68 previously stored the N-bit output of the first ADC circuit 66 so coupling the analog input signal Vin to onto the DAC circuit 68 can generate a residue charge on the common terminal 70.

At block 412, the method 400 can include sampling the combination of the noise charge and the residue charge. For example, the amplifier circuit 72 can transfer (and amplify) the residue charge from the common terminal 70 and the control circuit 80 can open switch 86 to sample the residue charge and the noise charge that remains on the output 76 of the amplifier onto the DAC circuit 78, as in FIG. 3H. The noise charge can be filtered using a dynamic filter prior to sampling by opening switch 90, as in FIG. 3G, after a voltage has settled.

At block 414, the method 400 can include subtracting the sampled noise charge from the sampled combination of the noise charge and the residue charge to cancel the noise charge. For example, the control circuit 80 can control a subtraction of the sampled noise charge on DAC circuit 78 of the second stage from the sampled combination of the noise charge and the residue charge on DAC circuit 96 of the second stage. In this manner, correlated double sampling is achieved.

In some example implementations, the ADC circuit 100 of FIGS. 3A-3H can be differentially configured, such as shown in FIG. 4. Thus, the method 400 can further include coupling differential analog input signals Vinp (e.g., positive) and Vinm (e.g., negative), as shown in FIG. 4, onto a top portion and a bottom portion of ADC circuit 200, respectively, using switches 82A, 92A and 82B, 92B.

Various Notes

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also; in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A method for performing correlated double sampling on an analog input signal coupled to a first ADC circuit and a digital-to-analog converter (DAC) circuit of a first stage of a pipelined analog-to-digital (ADC) circuit, the method comprising:
   opening a switch to decouple the DAC circuit of the first stage from a bias voltage, the opening resulting in a noise charge onto the DAC circuit of the first stage;
   sampling the noise charge;
   loading an output of the first ADC circuit of the first stage onto the DAC circuit of the first stage to generate a residue charge;
   sampling the combination of the noise charge and the residue charge; and
   subtracting the sampled noise charge from the sampled combination of the noise charge and the residue charge to cancel the noise charge.

2. The method of claim 1, wherein sampling the noise charge includes:
   filtering the noise charge.

3. The method of claim 2, wherein filtering the noise charge includes:
   settling a voltage; and
   after settling the voltage, reducing a bandwidth to band limit the noise charge.

4. The method of claim 1, further comprising:
   amplifying the noise charge prior to sampling the noise charge; and
   amplifying the residue charge prior to sampling the combination of the noise charge and the residue charge.

5. The method of claim 1,
   wherein sampling the noise charge includes:
   sampling the noise charge onto a second stage of the pipelined ADC circuit, and
   wherein sampling the combination of the noise charge and the residue charge includes:
   sampling the combination of the noise charge and the residue charge onto the second stage.

6. The method of claim 1, wherein the pipelined ADC circuit is a differential ADC circuit, and wherein coupling an analog input signal includes:
   coupling a differential analog input signal.

7. A method for performing correlated double sampling on an analog input signal coupled to an ADC circuit of a first stage of a pipelined analog-to-digital ADC circuit, the method comprising:
   loading an output of the first ADC circuit of the first stage onto a DAC circuit of the first stage;
   opening a switch to decouple the DAC circuit of the first stage from a bias voltage, the opening resulting in a noise charge onto the DAC circuit of the first stage;
   sampling the noise charge;
   coupling the analog input signal onto the DAC circuit of the first stage to generate a residue charge;
   sampling the combination of the noise charge and the residue charge; and
   subtracting the sampled noise charge from the sampled combination of the noise charge and the residue charge to cancel the noise charge.

8. The method of claim 7, wherein sampling the amplified noise charge onto the first capacitor array of the DAC circuit of the second stage includes:
   filtering the amplified noise charge.

9. The method of claim 8, wherein filtering the amplified noise charge includes:
  settling a voltage; and
  after settling the voltage, reducing a bandwidth to band limit the noise charge.

10. The method of claim 7, further comprising:
  amplifying the noise charge prior to sampling the noise charge; and
  amplifying the residue charge prior to sampling the combination of the noise charge and the residue charge.

11. The method of claim 7,
  wherein sampling the noise charge includes:
  sampling the noise charge onto a second stage of the pipelined ADC circuit, and
  wherein sampling the combination of the noise charge and the residue charge includes:
  sampling the combination of the noise charge and the residue charge onto the second stage.

12. The method of claim 7, wherein the pipelined ADC circuit is a differential ADC circuit, and wherein coupling an analog input signal includes:
  coupling a differential analog input signal.

13. A pipelined analog-to-digital converter (ADC) circuit for performing correlated double sampling on an analog signal coupled to a first stage of the pipelined ADC circuit, the first stage including a first ADC circuit and a digital-to-analog converter (DAC) circuit coupled to an output if the first ADC circuit, the pipelined ADC circuit comprising:
  a control circuit configured to control operation of a plurality of switches to:
    open a switch to decouple the DAC circuit of the first stage from a bias voltage, the opening resulting in a noise charge onto the DAC circuit of the first stage;
    sample the noise charge;
    load an output of the first ADC circuit of the first stage onto the DAC circuit of the first stage to generate a residue charge;
    sample the combination of the noise charge and the residue charge; and
    subtract the sampled noise charge from the sampled combination of the noise charge and the residue charge to cancel the noise charge.

14. The pipelined ADC circuit of claim 13, further comprising:
  a dynamic filter, wherein the control circuit configured to control operation of the plurality of switches to sample the noise charge is configured to control operation of the plurality of switches to:
  filter the noise charge using the dynamic filter.

15. The pipelined ADC circuit of claim 13, further comprising:
  an amplifier circuit, wherein the control circuit configured to control operation of the plurality of switches to:
  amplify the noise charge prior to sampling the noise charge; and
  amplify the residue charge prior to sampling the combination of the noise charge and the residue charge.

16. The pipelined ADC circuit of claim 13, wherein the analog input signal is a differential analog input signal, and wherein the pipelined ADC circuit is arranged in a differential configuration.

17. A pipelined analog-to-digital converter (ADC) circuit for performing correlated double sampling on an analog input signal coupled to a first ADC circuit of a first stage of the pipelined ADC circuit, the first stage including the first ADC circuit and a digital-to-analog converter (DAC) circuit coupled to an output of the first ADC circuit, the pipelined ADC circuit comprising:
  a control circuit configured to control operation of a plurality of switches to:
    load an output of the first ADC circuit of the first stage onto the DAC circuit of the first stage;
    open a switch to decouple the DAC circuit of the first stage from a bias voltage, the opening resulting in a noise charge onto the DAC circuit of the first stage;
    sample the noise charge;
    couple the analog signal onto the DAC circuit of the first stage to generate a residue charge;
    sample the combination of the noise charge and the residue charge; and
    subtract the sampled noise charge from the sampled combination of the noise charge and the residue charge to cancel the noise charge.

18. The pipelined ADC circuit of claim 17, further comprising:
  a dynamic filter, wherein the control circuit configured to control operation of the plurality of switches to sample the noise charge is configured to control operation of the plurality of switches to:
  filter the noise charge using the dynamic filter.

19. The pipelined ADC circuit of claim 17, further comprising:
  an amplifier circuit, wherein the control circuit configured to control operation of the plurality of switches to:
  amplify the noise charge prior to sampling the noise charge; and
  amplify the residue charge prior to sampling the combination of the noise charge and the residue charge.

20. The pipelined ADC circuit of claim 17, wherein the analog input signal is a differential analog input signal, and wherein the pipelined ADC circuit is arranged in a differential configuration.

21. A pipelined analog-to-digital converter (ADC) circuit for performing correlated double sampling on an analog input signal coupled to a first stage of the pipelined ADC circuit, the first stage including a first ADC circuit and a digital-to-analog converter (DAC) circuit coupled to an output of the first ADC circuit, the pipelined ADC circuit comprising:
  means for decoupling the DAC circuit of the first stage from a bias voltage, the decoupling resulting in a noise charge onto the DAC circuit of the first stage;
  means for sampling the noise charge;
  means for loading an output of the first ADC circuit of the first stage onto the DAC circuit of the first stage to generate a residue charge;
  means for sampling the combination of the noise charge and the residue charge; and
  means for subtracting the sampled noise charge from the sampled combination of the noise charge and the residue charge to cancel the noise charge.

22. A pipelined analog-to-digital converter (ADC) circuit for performing correlated double sampling on an analog input signal coupled to a first ADC circuit of a first stage of the pipelined ADC circuit, the first stage including the first ADC circuit and a digital-to-analog converter (DAC) circuit coupled to an output of the first ADC circuit, the pipelined ADC circuit comprising:
  means for loading an output of the first ADC circuit of the first Mage onto the DAC circuit of the first stage;

means for decoupling the DAC circuit of the first stage from a bias voltage, the decoupling resulting in a noise charge onto the DAC circuit of the first stage;
means for sampling the noise charge;
means for coupling the analog input signal onto the DAC circuit of the first stage to generate a residue charge;
means for sampling the combination of the noise charge and the residue charge; and
means for subtracting the sampled noise charge from the sampled combination of the noise charge and the residue charge to cancel the noise charge.

* * * * *

UNITED STATES PATENT AND TRADEMARK OFFICE
CERTIFICATE OF CORRECTION

PATENT NO. : 10,128,859 B1  
APPLICATION NO. : 15/899883  
DATED : November 13, 2018  
INVENTOR(S) : Rajasekhar et al.

Page 1 of 1

It is certified that error appears in the above-identified patent and that said Letters Patent is hereby corrected as shown below:

In the Claims

In Column 14, Line 48, in Claim 7, delete "ADC" and insert --(ADC)-- therefor

In Column 15, Line 25, in Claim 13, after "analog", insert --input--

In Column 16, Line 67, in Claim 22, delete "Mage" and insert --stage-- therefor

Signed and Sealed this  
Twenty-fourth Day of March, 2020

Andrei Iancu  
*Director of the United States Patent and Trademark Office*